United States Patent
Kim et al.

(10) Patent No.: US 9,961,790 B2
(45) Date of Patent: May 1, 2018

(54) PRINTED CIRCUIT BOARD (PCB), PCB ASSEMBLY, AND WASHING MACHINE INCLUDING THE SAME

(71) Applicant: SAMSUNG ELECTRONICS CO., LTD., Suwon-si (KR)

(72) Inventors: Kyu Sik Kim, Yongin-si (KR); Gi Eun Lee, Geochang-gun (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days. days.

(21) Appl. No.: 15/512,275

(22) PCT Filed: Aug. 13, 2015

(86) PCT No.: PCT/KR2015/008504
§ 371 (c)(1),
(2) Date: Mar. 17, 2017

(87) PCT Pub. No.: WO2016/072596
PCT Pub. Date: May 12, 2016

(65) Prior Publication Data
US 2017/0280575 A1    Sep. 28, 2017

(30) Foreign Application Priority Data

Nov. 4, 2014   (KR) ......................... 10-2014-0152095

(51) Int. Cl.
*D06F 37/20*   (2006.01)
*H05K 1/02*    (2006.01)
(Continued)

(52) U.S. Cl.
CPC ............. *H05K 5/065* (2013.01); *D06F 37/20* (2013.01); *H05K 1/02* (2013.01); *H05K 5/069* (2013.01);
(Continued)

(58) Field of Classification Search
CPC .. H05K 5/06; H05K 1/02; H05K 7/06; H05K 5/065; H05K 5/069; H05K 10/00; H05K 2203/1147; D06F 37/20
(Continued)

(56) References Cited

U.S. PATENT DOCUMENTS

2011/0056250 A1*  3/2011  Kim ..................... D06F 39/028
                                              68/17 R
2013/0091904 A1*  4/2013  Kim .................... A47L 15/4293
                                              68/3 R
(Continued)

FOREIGN PATENT DOCUMENTS

| JP | 2009-295704 | 12/2009 |
| KR | 1999-0062387 | 7/1999 |
| KR | 10-2008-0098887 | 11/2008 |

OTHER PUBLICATIONS

International Search Report dated Nov. 27, 2015 in corresponding International Application No. PCT/KR2015/008504.
(Continued)

*Primary Examiner* — Timothy Thompson
*Assistant Examiner* — Michael F McAllister
(74) *Attorney, Agent, or Firm* — Staas & Halsey LLP

(57) ABSTRACT

A printed circuit board (PCB) having an improved waterproof structure for preventing corrosion of a substrate is disclosed. A plurality of screen-printed protrusions is provided at the PCB surface. The plurality of protrusions allow water to be formed in waterdrops so that the waterdrops can flow to the outside of the PCB. The PCB is arranged to have a tilted structure for facilitating discharge of the water. The tilted structure discharges waterdrops to a lower side of the PCB. The PCB and a PCB assembly having the same are applicable to electronic appliances such as a washing machine.

19 Claims, 8 Drawing Sheets

(51) Int. Cl.
    *H05K 7/06*    (2006.01)
    *H05K 10/00*   (2006.01)
    *H05K 5/06*    (2006.01)
(52) U.S. Cl.
    CPC ............... *H05K 7/06* (2013.01); *H05K 10/00* (2013.01); *H05K 2203/1147* (2013.01)
(58) Field of Classification Search
    USPC ........................................................ 174/539
    See application file for complete search history.

(56) References Cited

U.S. PATENT DOCUMENTS

| | | | | |
|---|---|---|---|---|
| 2013/0241057 A1* | 9/2013 | Yu | ....................... | H01L 25/0657 257/738 |
| 2014/0266903 A1* | 9/2014 | Ding | .................... | H05K 9/0015 342/385 |
| 2014/0298865 A1* | 10/2014 | Park | .................... | H03K 17/962 68/12.02 |

OTHER PUBLICATIONS

Written Opinion of the International Searching Authority dated Nov. 27, 2015 in corresponding International Application No. PCT/KR2015/008504.

\* cited by examiner

[Fig. 1]
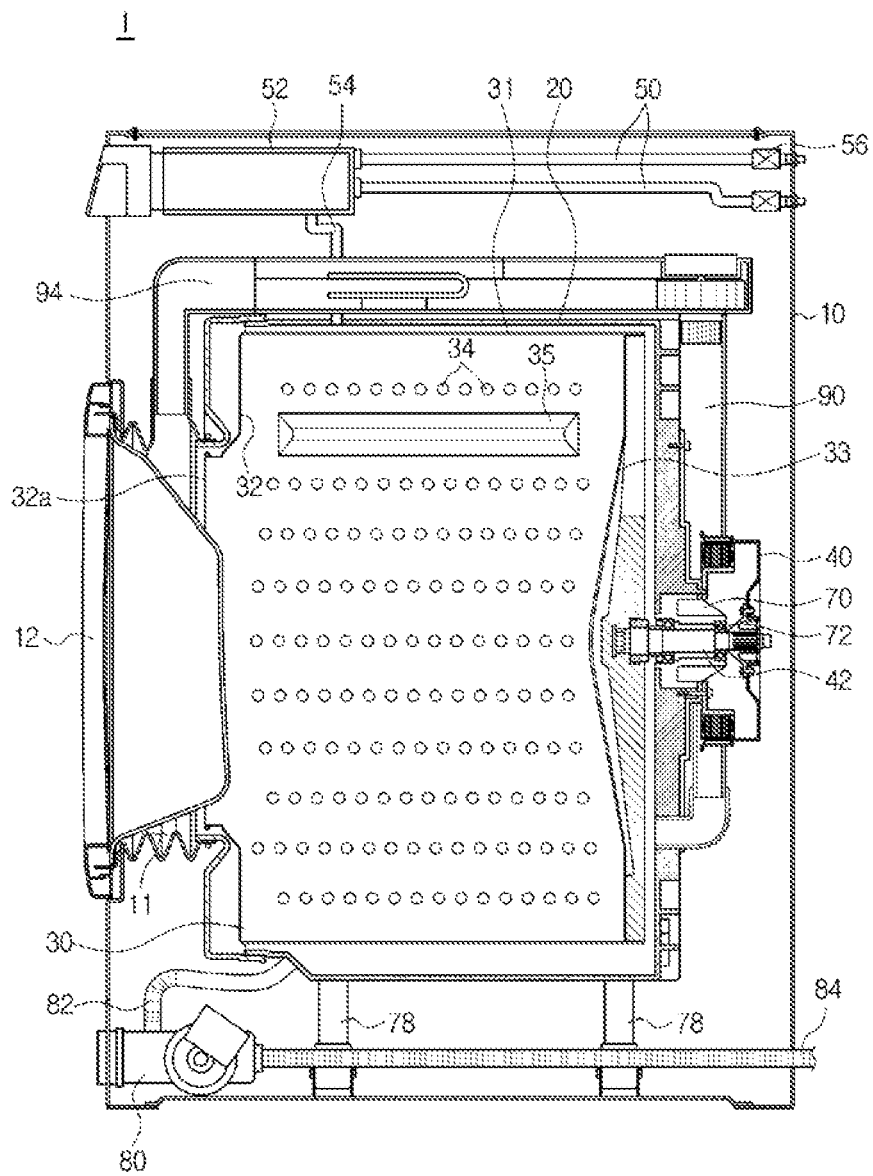

[Fig. 2]
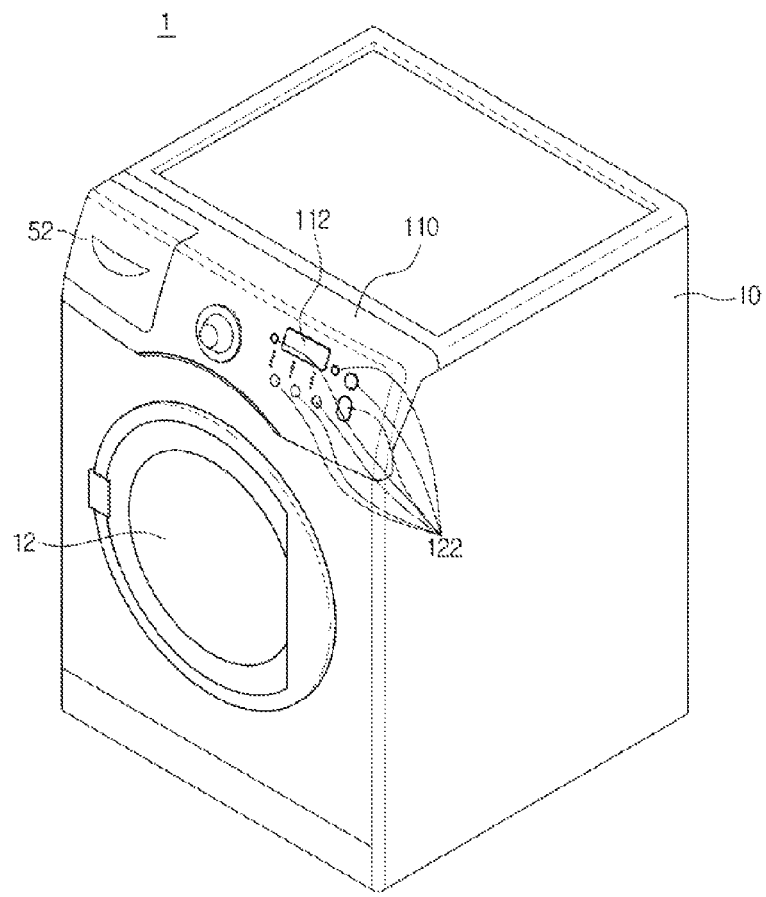
[Fig. 3]
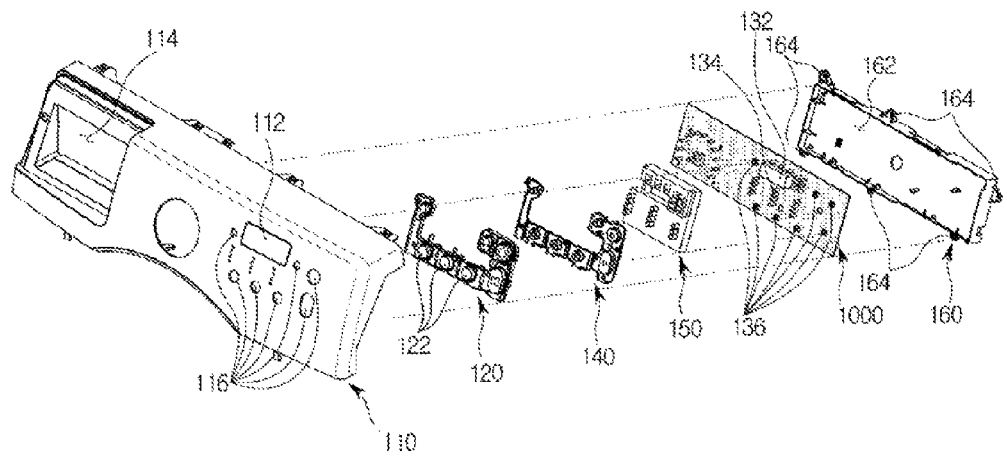

[Fig. 4]
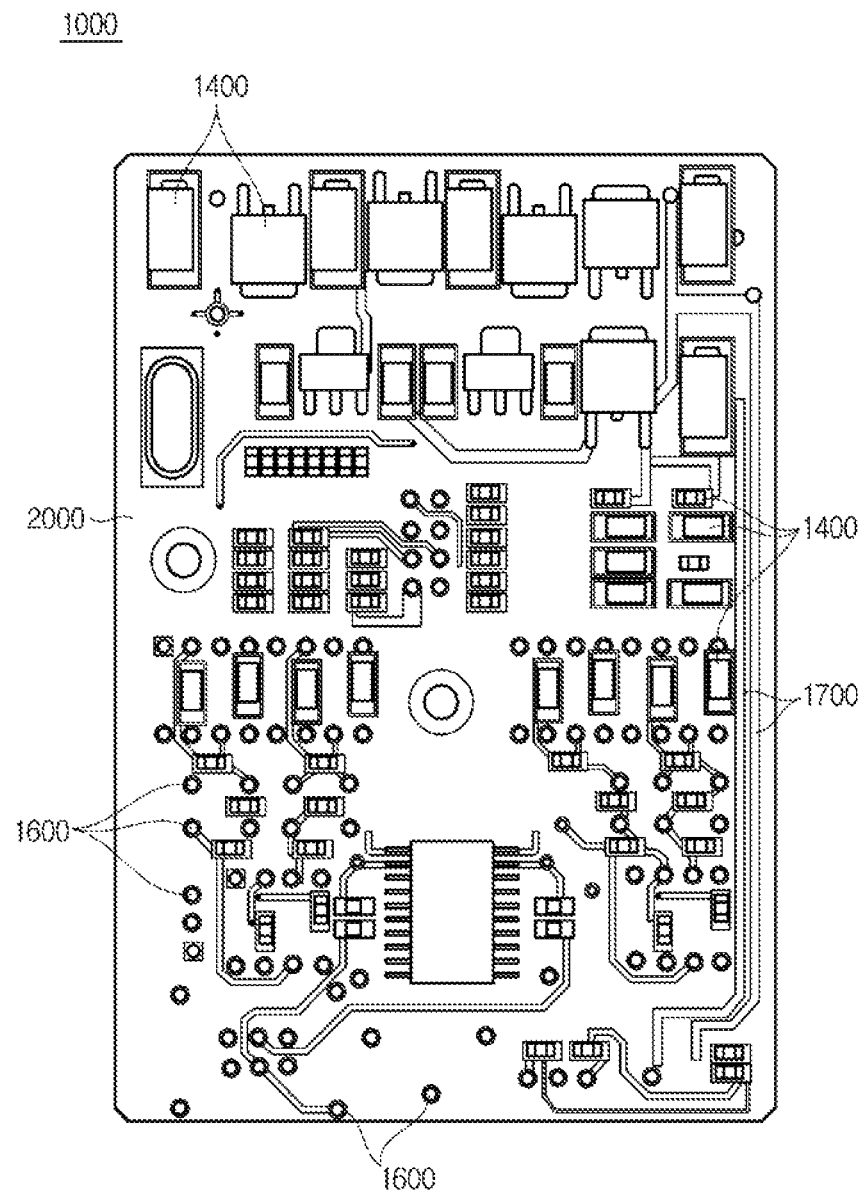

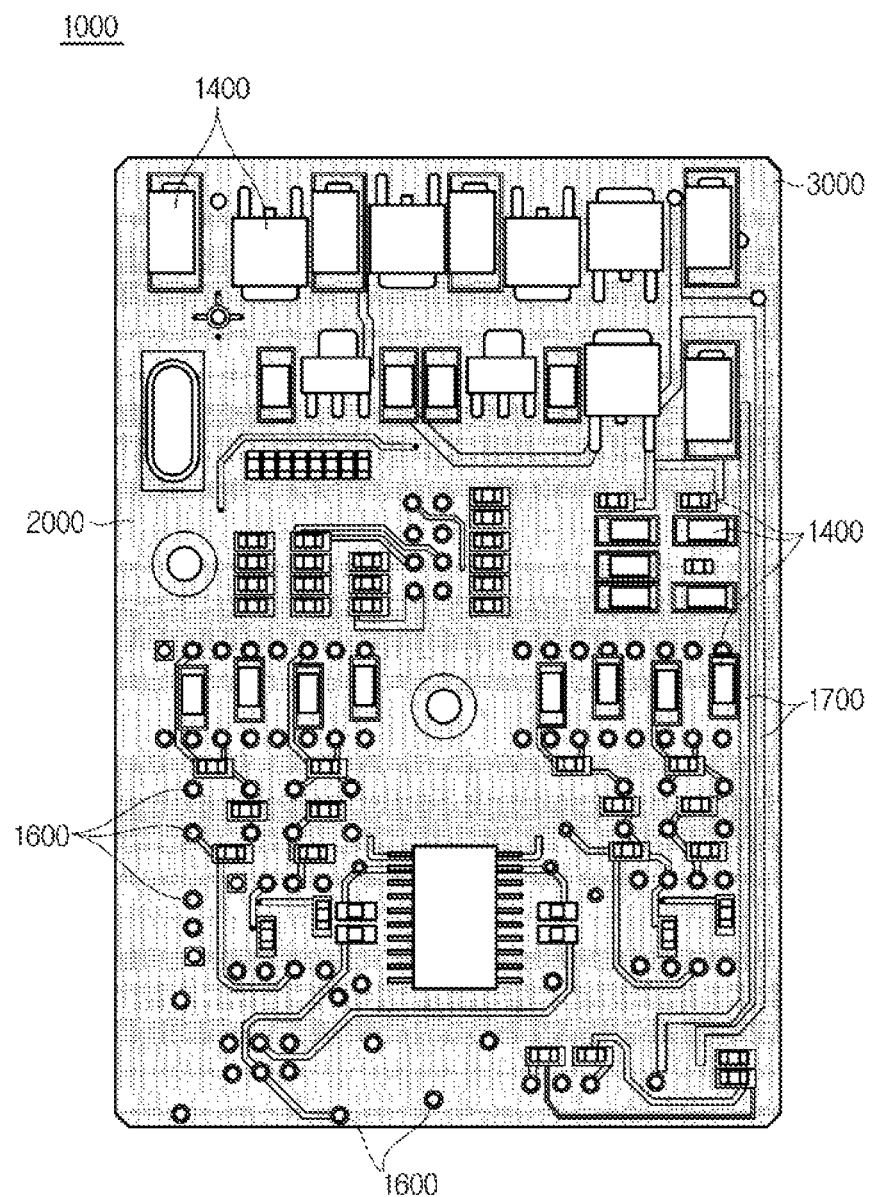
[Fig. 5]

[Fig. 6]
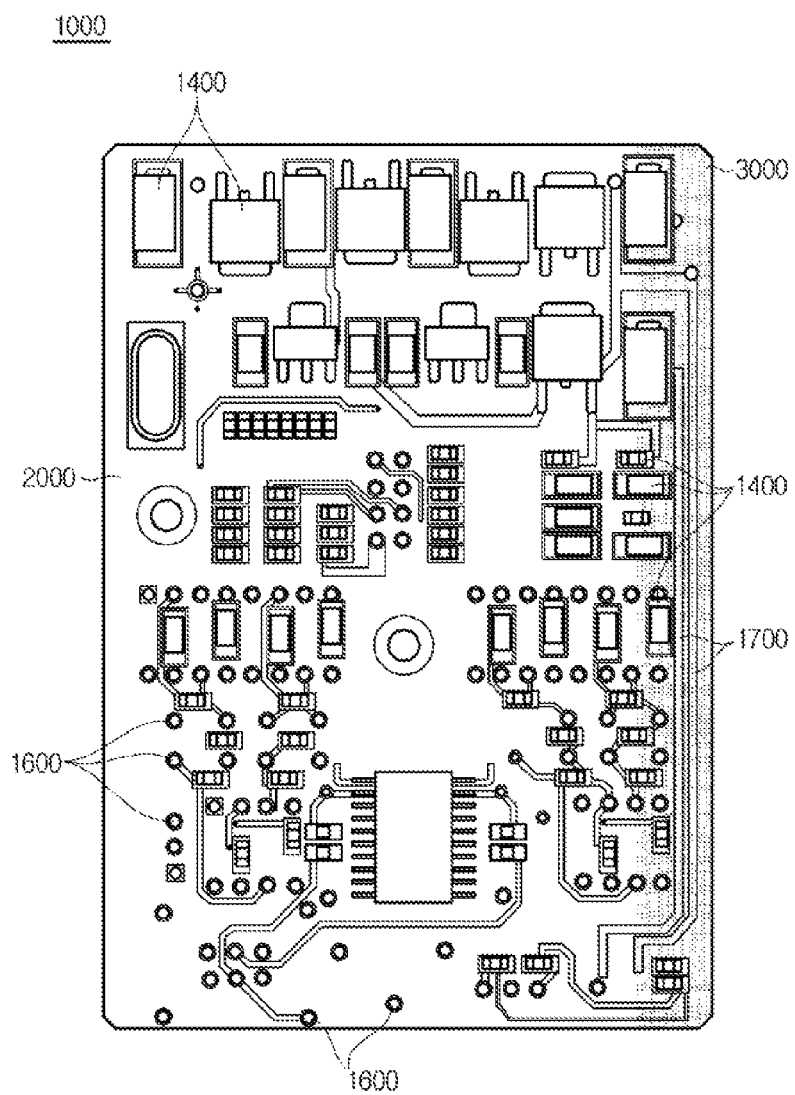
[Fig. 7]
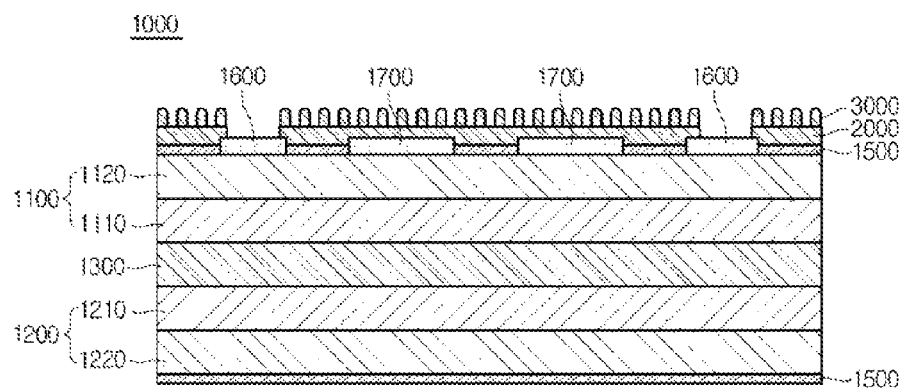

[Fig. 8]
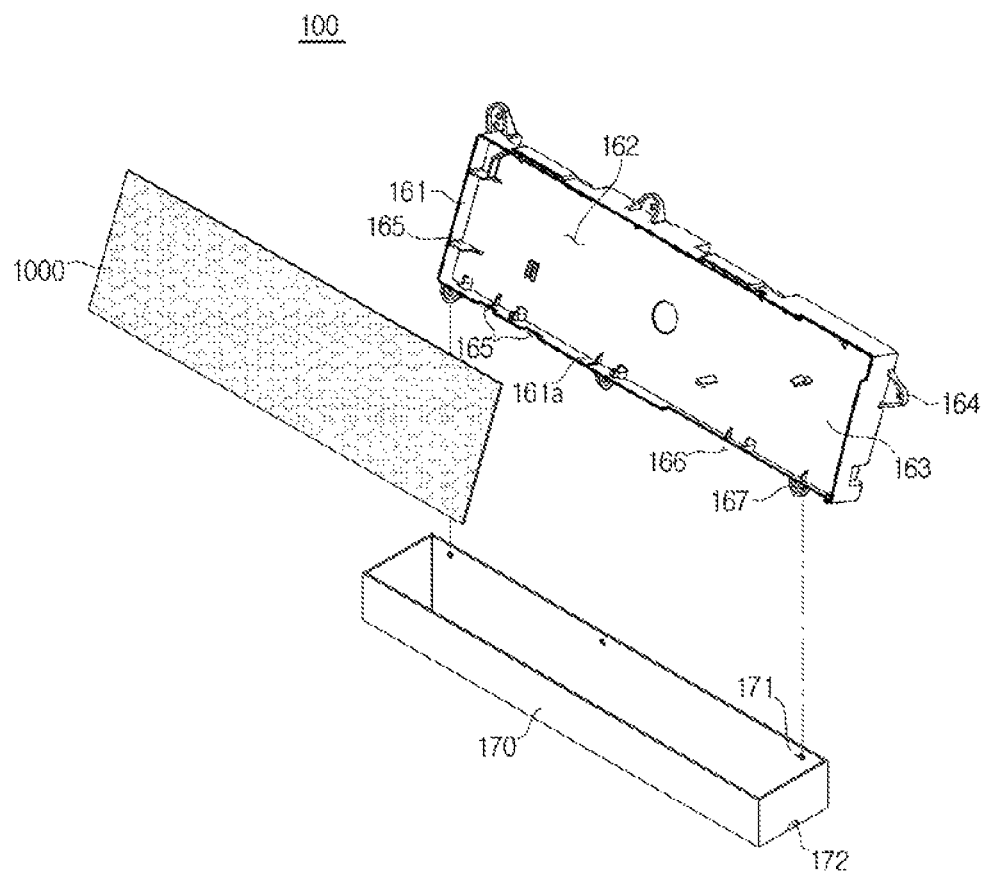

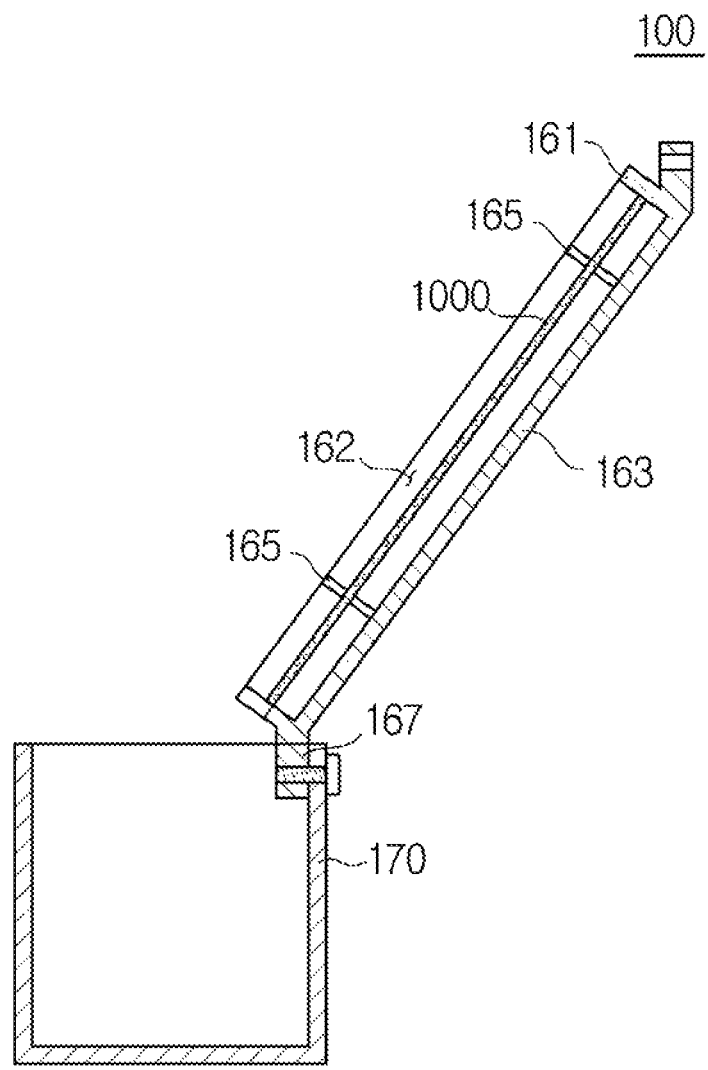
[Fig. 9]

[Fig. 10]
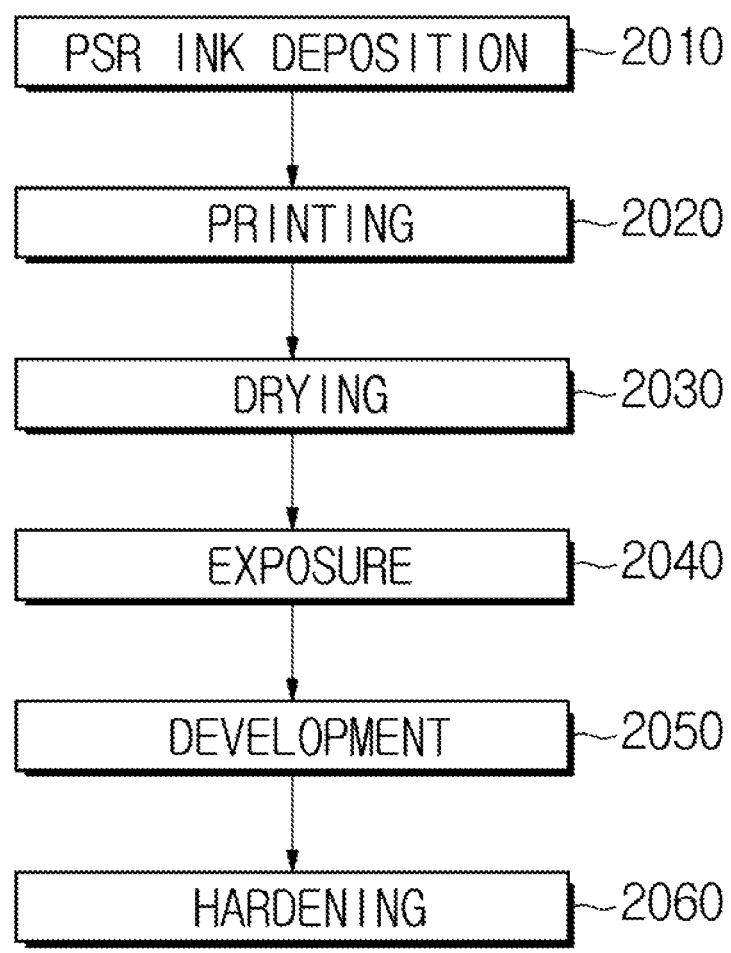

PRINTED CIRCUIT BOARD (PCB), PCB ASSEMBLY, AND WASHING MACHINE INCLUDING THE SAME

CROSS-REFERENCE TO RELATED APPLICATIONS

This application is a U.S. National Stage Application, which claims the benefit under 35 U.S.C. § 371 of PCT International Patent Application No. PCT/KR2015/008504, filed Aug. 13, 2015, which claims the foreign priority benefit under 35 U.S.C. § 119 of Korean Patent Application No. 10-2014-0152095, filed Nov. 4, 2014, the contents of which are incorporated herein by reference.

TECHNICAL FIELD

Embodiments of the present invention relate to a printed circuit board (PCB) and a washing machine including the same, and more particularly to a PCB having a waterproof structure, a PCB assembly having the PCB, and a washing machine including the PCB assembly.

BACKGROUND ART

Generally, various electronic appliances or communication devices include a variety of constituent elements therein, and each of the appliances and devices also includes a PCB configured to electrically interconnect the constituent elements.

The PCB is configured by printing a printed circuit formed of a conductive material onto an electrical insulation substrate, such that various kinds of electronic components are densely populated onto a flat board of the PCB.

For this purpose, installation positions of respective electronic components are fixed, and a circuit line for interconnecting the electronic components is printed on the flat board, such that the respective electronic components can be fixed.

However, if moisture or humidity permeates into electronic appliances (for example, a washing machine, a dishwasher, an air-conditioner, etc.) in which water is used, water accumulates on the PCB, resulting in corrosion of the PCB.

DISCLOSURE

Technical Problem

An object of the present invention is to provide an a printed circuit board (PCB) having an improved structure for preventing moisture or humidity from accumulating on the PCB, a PCB assembly having the PCB, and a washing machine having the PCB assembly.

Technical Solution

The objects of the present invention can be achieved by providing a printed circuit board (PCB) apparatus including: a substrate configured to have a plurality of substrate holes; a printed circuit printed onto the substrate; at least one electronic component is populated onto one surface of the substrate; a photoimageable solder resist (PSR) coating provided at the one surface of the substrate; and a plurality of protrusions provided in at least some parts of the one surface of the substrate.

The printed circuit may include the plurality of protrusions provided in at least some parts of the other surface of the printed circuit.

the plurality of protrusions may be spaced apart from each other by a predetermined distance, and the predetermined distance may not be longer than a diameter of one protrusion.

the plurality of protrusions may be successively and regularly arranged.

the plurality of protrusions may be arranged along one side of the printed circuit, and are provided in some parts adjacent to the one side of the printed circuit.

the plurality of protrusions may be provided at an entire surface of the printed circuit.

the plurality of protrusions may be screen-printed onto the printed circuit.

the plurality of protrusions may be formed of a photoimageable solder resist (PSR) ink material having photosensitive characteristics.

In accordance with another aspect of the present invention, a printed circuit board (PCB) assembly includes: a printed circuit board (PCB) on which electronic components are populated; a plurality of protrusions provided in at least some parts of a surface of the PCB in such a manner that water flows to the outside of the PCB when the water permeates into the PCB; and a PCB housing coupled to a rear surface of the PCB so as to accommodate the PCB.

The PCB may be arranged to have a tilted structure through which moisture or humidity permeating into the PCB flows to the outside of the PCB along the plurality of protrusions.

the plurality of protrusions may be arranged at an entire surface of the PCB.

the plurality of protrusions may be arranged along one side of the PCB, and may be provided in some parts adjacent to the one side of the PCB.

The one surface of the PCB may be a lower side of the PCB arranged to be tilted.

The PCB assembly may further include: a tray configured to store water flowing down to a lower part of the PCB along the plurality of protrusions.

The tray may be supported by a lower end of the PCB housing in such a manner that the tray is located at a lower end of the PCB.

In accordance with another aspect of the present invention, a washing machine includes: a cabinet; a control panel provided at a front surface of the cabinet; a printed circuit board (PCB) provided at a rear side of the control panel; and a PCB housing coupled to a rear surface of the control panel so as to accommodate the PCB therein, wherein the PCB includes a plurality of protrusions provided in at least some parts of a surface of the PCB in such a manner that water flows to the outside of the PCB when the water permeates into the PCB.

the plurality of protrusions may be provided at an entire surface of the PCB.

the plurality of protrusions may be arranged along a lower side of the PCB arranged to be tilted, and are provided in some parts adjacent to the lower side of the PCB.

The washing machine may further include: a button unit provided in the control panel; and a waterproofing member disposed between the button unit and the PCB so as to prevent water received in the button unit from permeating into the PCB.

Advantageous Effects

As is apparent from the above description, a plurality of protrusions or embossed parts is provided at some parts of one surface of the PCB, and moisture or humidity is prevented from accumulating on the PCB, such that the moisture or humidity can be easily discharged from the surface of the PCB.

In addition, the PCB contained in the PCB assembly is arranged to be tilted at a predetermined angle, such that moisture or humidity not accumulated on the PCB by a plurality of protrusions rolls down from the PCB and the moisture or humidity can be easily discharged from the PCB.

DESCRIPTION OF DRAWINGS

The accompanying drawings, which are included to provide a further understanding of the invention, illustrate embodiments of the invention and together with the description serve to explain the principle of the invention.

FIG. 1 is a plan view illustrating a PCB having no plurality of protrusions according to an embodiment of the present invention.

FIG. 2 is a plan view illustrating a PCB according to an embodiment of the present invention.

FIG. 3 is a block diagram illustrating a process for forming a PSR (Photoimageable Solder Resist) coating unit according to an embodiment of the present invention.

FIG. 4 is a cross-sectional view illustrating a PCB according to an embodiment of the present invention.

FIG. 5 is an exploded perspective view illustrating a PCB assembly according to an embodiment of the present invention.

FIG. 6 is a cross-sectional view illustrating a PCB assembly according to an embodiment of the present invention.

FIG. 7 is a cross-sectional view illustrating a washing machine according to an embodiment of the present invention.

FIG. 8 is a perspective view illustrating a washing machine according to an embodiment of the present invention.

FIG. 9 is an exploded perspective view illustrating a control panel and a PCB assembly according to an embodiment of the present invention.

FIG. 10 is a cross-sectional view illustrating a PCB according to another embodiment of the present invention.

BEST MODE

Reference will now be made in detail to the embodiments of the present invention, examples of which are illustrated in the accompanying drawings, wherein like reference numerals refer to like elements throughout.

FIG. 1 is a plan view illustrating a PCB having no plurality of protrusions part according to an embodiment of the present invention. FIG. 2 is a plan view illustrating a PCB according to an embodiment of the present invention. FIG. 3 is a block diagram illustrating a process for forming a PSR (Photoimageable Solder Resist) coating unit according to an embodiment of the present invention. FIG. 4 is a cross-sectional view illustrating a PCB according to an embodiment of the present invention.

Referring to FIGS. 1 to 4, a PCB 1000 includes an upper layer 1100 in which a copper foil layer 1120 for forming a circuit pattern in an insulation film 1110 is thermally compressed; and a lower layer 1200 in which a copper foil layer 1220 for forming a circuit pattern in an insulation film 1210 is thermally compressed. In the PCB 1000, the upper layer 1100 and the lower layer 1200 are attached to each other by a boding sheet 1300.

Dry films (not shown) for forming the circuit patterns are laminated between the copper foil layers (1120, 1220) of the upper layer 1100 and the lower layer 1200, a circuit pattern 1700 is completed through an exposure and etching process, and a mounting unit 1600 for populating electronic components 1400 is provided.

An upper part of the mounting unit 1600 is exposed, and a protective film 1500 is attached to the remaining parts other than the mounting unit 1600 at the exposed surface.

The circuit pattern 1700 may be formed by the exposure and etching process, and the mounting unit 1600 connected to the circuit pattern 1700 may be formed at an arbitrary inner position of each edge part of the circuit pattern 1700.

Differently from the above-mentioned embodiment, the circuit pattern 1700 may be located not only at the outer side surface of the PCB 1000 but also at the inner side of the PCB 100, such that the circuit pattern 1700 may be arranged in a 3D shape.

In addition, the mounting unit 1600 is arranged at both sides of the PCB 1000, so that the electronic components 1400 may be populated at both sides of the PCB 1000.

Therefore, the PCB 1000 is wire-bonded to or bump-contacted with the electronic components 1400 populated onto the PCB 1000, such that the PCB 1000 can be electrically connected to the electronic components 1400.

A PSR (Photoimageable Solder Resist) coating 2000 formed by screen-printing of PSR ink may be provided at the surface of the PCB 1000.

The PSR ink acting as photosensitive ink may include at least one of a main ink material (constituting the ink base composed of resin, drying oil, a solvent, etc.), a coloring material, a solvent, a defoamer for preventing foaming of ink, a leveling material that facilitates the printing process by adjusting ink fluidity and at the same time maintains a predetermined thickness, and a stabilizer for stabilizing physical properties of the ink.

Referring to FIG. 3, the printing process of the PSR coating 2000 may include a deposition process 2010 for depositing PSR ink onto a silk screen.

Thereafter, the PSR ink deposited onto the screen is processed by the printing process 2020 in which the PSR ink is pushed out to the PCB 1000 through squeezing and is printed on the PCB 1000 in a shape of silk contained in the screen.

After completion of the printing process 2020, the PSR ink is processed by the drying process 2030 in which the PSR ink is semi-hardened instead of being fully hardened. The drying process 2030 of the PSR ink may be used to efficiently carry out the subsequent exposure process 2040.

In the exposure process 2040, a film is combined with the PCB 1000, ultraviolet (UV) light is emitted thereto, and a polymer contained in the PSR ink is polymerized, resulting in combination of the PSR ink.

In the exposure process 2040, the amount of exposure light should be properly adjusted according to the printed PSR ink using the light amount measurement device or the like, and the exposure light should be uniformly irradiated onto all parts of an exposure frame.

After completion of the exposure process 2040, the development process 2050 in which the PSR ink of an unexposed part at which the UV light is not received is carried out. The unexposed part is removed from the PCB 1000 by a developer solution.

After completion of the PSR ink development, the hardening process 2060 in which the PSR coating 2000 is completely hardened using hot air is carried out so that the PSR ink can be completely hardened.

The PSR coating 2000 is printed onto the upper end of the PCB 1000 so that the PSR coating 2000 can prevent not only the occurrence of a bridge of a solder but also oxidation of the exposed circuit pattern 1700 during population of the electronic components 1900.

Referring to FIG. 4, the PCB 1000 may include a plurality of protrusions (or embossed parts) provided at the upper end of the PSR coating 2000.

the plurality of protrusions 3000 may be formed of PSR ink formed of the same material as the PSR ink 2000. the plurality of protrusions 3000 may be coated onto the PCB using the same process as in the process in which the PSR coating 2000 is coated onto the PCB 1000.

In order to form the plurality of protrusions 3000, the silk screen (not shown) on which the PSR ink is deposited may construct the silk weaving in such a manner that several plurality of protrusions 3000 can be printed onto the PCB 1000.

the plurality of protrusions 3000 may be printed throughout the entire area of a side surface on which the electronic components 1400 of the PCB 1000 are populated.

Several plurality of protrusions 3000 may be spaced apart from each other by a predetermined distance, and may be arranged in a successive or regular pattern. The spacing between the plurality of protrusions 3000 may not exceed a diameter of each protrusion 3000, and may relate to surface tension of water drops.

If the spacing is larger in size than the surface area of the plurality of protrusions 3000, fluidity is deteriorated due to the surface tension of water such that water accumulates in the spacing, so that it is difficult for the water to be discharged from the PCB 1000 to the outside.

The shape of the plurality of protrusions 3000 is not limited to a cylindrical shape shown in the above embodiment, and the plurality of protrusions 3000 may be formed in any one of various shapes through which there is a difference between surface levels of the PCB 1000 because of the presence of the plurality of protrusions 3000 without departing from the scope or spirit of the present invention. For example, each protrusion 3000 may be formed in an oval-shaped cylinder, a square pillar, or a hemisphere.

The height of each protrusion may be identical to a thickness of the PSR coating 2000.

If moisture or humidity permeates into the PCB 1000 including the plurality of protrusions 3000, the plurality of protrusions 3000 may have the following effects.

If moisture or humidity received from the external part is brought into contact with the PCB 1000, the moisture or humidity is condensed on the PCB 1000, resulting in formation of water drops. In accordance with the conventional art having no plurality of protrusions, water drops are formed in the PSR coating 2000, and the water drops are collected on the flat surface of the PSR coating 2000, resulting in corrosion of the PCB 1000.

Water has tension (i.e., surface tension) of the free surface of liquid, such that water has contractile properties that desire to contact a smaller region. Therefore, as the surface area contacting water is reduced in size, the water is contracted by tension, resulting in formation of a water drop similar in shape to a sphere.

In accordance with the embodiment, a water drop is formed at the upper end of each protrusion 3000 formed on the PCB. The surface area of the upper end of the each protrusion 3000 has a small surface area, differently from the PSR coating 2000 formed of the uppermost surface of the conventional art, so that the water drop is more contracted in size, resulting in formation of the water drop similar in shape to a sphere.

As the water drop is similar in shape to the sphere, the water mobility or fluidity gradually increases, so that the water drop formed on the PCB 1000 including the plurality of protrusions 3000 can be easily discharged to the outside of the PCB 1000.

Therefore, the water mobility or fluidity increases due to the plurality of protrusions 3000, such that moisture or humidity easily flows down to the outside of the PCB 1000, resulting in prevention of corrosion of the PCB 1000.

The PCB assembly 100 configured to discharge moisture or humidity permeated into the PCB 1000 to the outside of the PCB 1000 will hereinafter be described with reference to the attached drawings.

FIG. 5 is an exploded perspective view illustrating the PCB assembly according to an embodiment of the present invention. FIG. 6 is a cross-sectional view illustrating the PCB assembly according to an embodiment of the present invention.

Referring to FIGS. 5 and 6, the PCB assembly 1000 includes a PCB 1000; and a PCB housing 160 configured to include/support the PCB 1000.

For convenience of description and better understanding of the present invention, the above-mentioned constituent elements (e.g., the electronic components 1900, the printed circuit pattern, and the like) may be omitted from the PCB assembly shown in FIG. 5. In addition, a plurality of protrusions 3000 formed on the PCB 1000 may be exaggerated for convenience of description.

The PCB housing 160 may include an accommodation unit 162 configured to accommodate the PCB 1000 therein; a side frame 161 configured to form four sidewalls of the PCB housing 160; and a back frame 163 configured to form a back surface provided by a sidewall.

The accommodation unit 162 is formed by the four sidewalls, such that the PCB 1000 is accommodated and seated in the accommodation unit 162.

The PCB 1000 contained in the accommodation unit 162 may be supported by several support units 165 extended inward of the side frame 161, and may be bolted to a bolt groove (not shown) formed in the support unit 165.

The support unit 165 may be extended from a protrusion-shaped side frame 161, and protrudes toward the accommodation unit of the side frame 161. The PCB 1000 has a curved part through which the PCB 1000 can be supported in parallel to the accommodation unit 162, and the PCB 1000 is supported by the curved part.

Differently from the above embodiment, a plurality of PCBs 1000 can be seated in parallel to each other. In this case, the support unit 165 may be molded to have a plurality of curved grooves or combination grooves in such a manner that the plurality of PCBs 1000 can be supported in parallel to each other.

The PCB housing 160 may include a plurality of fastening units 164 formed at the outside of the side frame 161. The fastening unit 164 may be bolted to a main body of a product such as a washing machine or the like.

Referring to FIG. 6, the PCB housing 160 has a tilted structure in which the accommodation unit 162 is tilted, so that the PCB housing 160 having the tilted structure can be coupled to the product. Waterdrops formed by the plurality of protrusions 3000 flow down along a lower side of the PCB 1000 through the tilted structure, so that moisture or humidity can be discharged to the outside of the PCB 1000.

As described above, the surface area of each protrusion 3000 is small in size, water drops have superior mobility or fluidity, so that the water drops flow down along a lower side of the PCB 1000 through the tilted structure.

A plurality of discharge holes 166 may be provided at a lower side frame 161a so that water flowing down along the tilted structure can be discharged to the outside of the PCB housing 160 through the discharge holes 166.

A tray 170 configured to store the water that has flowed from the PCB and discharged through the discharge holes 166 may be provided at the lower end of the PCB housing 160. The tray 170 may temporarily store water therein, so that it can prevent the water from permeating into other electronic components installed into the product.

The tray 170 configured in the form of a general support or saucer may be formed to have various sizes and various shapes according to internal sizes of respective products.

A coupling groove 171 is formed at one sidewall of the tray 170, such that the coupling groove 171 is bolted to the coupling unit 167 extended downward of the lower side frame 161a. Water stored in the tray 170 is discharged through a discharge hole 172, and the discharge hole 172 may be connected to a drain structure of a product or an external part of the product.

The PCB 1000 including the above the plurality of protrusions 3000 and the PCB assembly 100 including the PCB may be used as constituent elements of all electronic appliances.

Specifically, the PCB 1000 and the PCB assembly 100 may be applied to electronic appliances (for example, a washing machine, a dishwasher, an air-conditioner, etc.) in which water is used.

The PCB 1000, the PCB assembly 100 including the PCB 1000, and the washing machine including the PCB assembly 100 will hereinafter be described with reference to the attached drawings.

FIG. 7 is a cross-sectional view illustrating a washing machine according to an embodiment of the present invention. FIG. 8 is a perspective view illustrating a washing machine according to an embodiment of the present invention.

Referring to FIGS. 7 and 8, the washing machine 1 may include a cabinet 10 configured to form an external appearance of the washing machine 1; a tub 20 arranged in the cabinet 10; a drum 30 rotatably arranged in the tub 20; and a motor 40 configured to drive the drum 30.

An inlet 11 through which laundry is input to the inside of the drum 30 may be formed at a front surface of the cabinet 10. The inlet 11 may be opened or closed by a door 12 mounted to the front surface of the cabinet 10. A water supply pipe 50 for supplying water to the tub 20 may be installed above the tub 20. One side of the water supply pipe 50 may be connected to the water supply valve 56, and the other side thereof may be connected to a detergent box 52.

The detergent box 52 may be connected to the tub 20 through a connection pipe 54. Water supplied through the water supply pipe 50 may pass through the detergent box 52 so that the water and a detergent are applied to the inside of the tub 20.

The tub 20 may be supported by a damper 78. The damper 78 may connect the outer surface of the tub 20 to the inner bottom surface of the cabinet 10.

The drum 30 may include a cylinder 31; a front plate 32 arranged at the front of the cylinder 31; and a rear plate 33 arranged at the rear of the cylinder 31. An opening 32a through which laundry is put into or taken out of the drum 30 is formed in the front panel 32. A drive shaft 42 for transmitting power of the motor 40 is connected to the rear plate 33.

A plurality of through-holes 34 for mobility (or fluidity) of wash water may be formed at the circumference of the drum 30, and a plurality of lifters 35 for lifting or dropping laundry may be installed at the inner circumference of the drum 30 during rotation of the drum 30.

The drive shaft 42 may be disposed between the drum 30 and the motor 40. One end of the drive shaft 42 may be connected to the rear plate 33, and the other end thereof may be extended outward of a rear wall of the tub 20. If the motor 40 drives the drive shaft 42, the drum 30 connected to the drive shaft 42 may rotate around the drive shaft 42.

A bearing housing 70 for rotatably supporting the drive shaft 42 may be mounted to a rear wall of the tub 20. The bearing housing 70 may be formed of an aluminum alloy, and may be inserted into the rear wall of the tub 20 when the tub 20 is injection-molded. A plurality of bearings 72 for facilitating rotation of the drive shaft 42 may be disposed between the bearing housing 70 and the drive shaft 42.

A drain pump 80, a connection hose 82, and a drain hose 84 are arranged below the tub 20. The drain pump 80 discharges water contained in the tub 20 to the outside of cabinet 10. The connection hose 82 connects the tub 20 to the drain pump 80 in such a manner that water contained in the tub 20 can be applied to the drain pump 80. The drain hose 84 directs the water pumped by the drain pump 80 to the outside of the cabinet 10.

A drying apparatus 90 is installed in the tub 20. The drying apparatus 90 can dry the air contained in the tub 20, and can supply the dry air to the inside of the tub 20.

A control panel and the PCB assembly 100 may be disposed at the front panel of the cabinet 10 such that the user can control the washing machine 1 using the control panel and the PCB assembly 100.

FIG. 9 is an exploded perspective view illustrating a control panel and a PCB assembly according to an embodiment of the present invention.

Referring to FIG. 9, the control panel and PCB assembly 100 according to an embodiment of the present invention may include a control panel 110 arranged to be tilted at a front surface of the cabinet 10; a button unit 120 coupled to a back surface of the control panel 110; a PCB 1000 arranged at the rear of the button unit 120 and connected to the button unit 120; a waterproofing member 140 coupled to a back surface of the button unit 120 and configured to prevent moisture and humidity from permeating into the PCB 1000; an LED guide 150 configured to support a plurality of LEDs (Light Emitting Diodes) elements 134 installed at the PCB 1000 as well as to prevent mixture of light emitted from the LED elements 134; and a PCB housing 160 fixed to the rear part of the control panel 110 and configured to sequentially include the button unit 120, the waterproofing member 140, and the PCB 1000.

The control panel 110 may include a display window 112, a detergent-box accommodation hole 114, and at least one button hole 116. Light emitted from a display element 132 penetrates the control panel in such a manner that the user can confirm the light. One side of the control panel 110 penetrates the detergent-box accommodation hole 114 through which the detergent box 52 is detachably coupled to the inside of the cabinet 10. The button unit 120 is coupled to at least one button hole 116, so that the at least one button hole 116 penetrates the control panel 110 so that the button hole 116 is exposed forward of the control panel 110.

The display element 132, a plurality of LED elements 134, and a button switch 136 may be provided at the front surface of the PCB 1000 in which various electronic components contained in the cabinet 10 are electrically connected. The display element 132 may display various operation states of the washing machine through the display window 112. The LED elements 134 may indicate various operation states of the display element 132 and the washing machine 1. The button switch 136 may operate by contacting at least one button 122 formed in the button unit 120. If the user presses the button 122, the button switch 136 is pressed by a contact protrusion (not shown) protruding from the back surface of the button 122, so that a specific operation of the washing machine 1 can be carried out through the PCB 1000.

The PCB housing 160 may include an accommodation unit 162 and a plurality of fastening units 164. The accommodation unit 162 may accommodate and support the button unit 120, the PCB 1000, the waterproofing member 140, and the LED guide 150. The fastening units 164 for coupling the PCB housing 160 to the rear surface of the control panel no may be formed at the outside of the accommodation unit 162. Here, the PCB housing 160 accommodates or includes the button unit 120, the PCB 1000, the waterproofing member 140, and the LED guide 150.

The waterproofing member 140 coupled to the rear surface of the button unit 120 may support the button unit 120, and at the same time may prevent water received through a gap between the control panel 110 and the button unit 120 from permeating into the PCB 1000.

The PCB assembly 100 may be provided in the washing machine 1 in parallel to the control panel 110 having a tilted structure. Therefore, the PCB assembly having a tilted structure is coupled to the washing machine 1, so that moisture or humidity permeating into the PCB 1000 can flow down to a lower part of the PCB 1000.

A drain passage (not shown) may be provided at the side facing the PCB 1000 of the waterproofing member 140. The waterproofing member 140 may allow the water flowing down from the plurality of protrusions 3000 of the PCB 1000 to be discharged to the outside of the PCB assembly 100 through the drain passage (not shown).

Another embodiment of the present invention will hereinafter be described in detail. The following embodiment of the present invention is different from the above-mentioned embodiment in terms of the distribution range of the plurality of protrusions 3000, a repeated description with respect to the same configuration as those of the above-mentioned embodiment will be omitted herein, and the following description is given focusing on such difference.

FIG. 10 is a cross-sectional view illustrating a PCB according to another embodiment of the present invention.

Referring to FIG. 10, the plurality of protrusions 3000 may be arranged along one side of the PCB 1000, and may be printed onto some regions adjacent to the one side of the PCB 1000.

As can be seen from FIG. 6, if the PCB 1000 having a tilted structure is coupled to the inside of the product and water permeates the PCB 1000, the water flows down to a lower part of the PCB 1000 through the tilted structure.

Although the water flows down to the lower end of the PCB 1000 through the tilted structure, the water is not discharged to the outside of the PCB 1000 due to surface tension of the water and may remain on the PCB 1000.

Therefore, several plurality of protrusions 3000 printed onto some regions of the PCB 1000 may be arranged at the lower end of the tilted structure when the PCB 1000 is arranged to be tilted.

Mobility or fluidity of the water remaining at the lower end of the PCB 1000 increases so that the water can be discharged to the outside of the PCB 1000.

The printing range of the plurality of protrusions 3000 is not limited to the present invention, and the plurality of protrusions 3000 may be printed onto some parts of the PCB 1000 in consideration of a PCB size and a tilted angle.

Although the embodiments of the present invention have been disclosed for illustrative purposes, those skilled in the art will appreciate that various modifications, additions and substitutions are possible, without departing from the scope and spirit of the invention as disclosed in the accompanying claims.

[Mode for Invention]

As described above, a related description has sufficiently been discussed in the above "Best Mode" for implementation of the embodiments of the present invention. Various embodiments have been described in the best mode for carrying out the invention.

INDUSTRIAL APPLICABILITY

According to the above-mentioned embodiments of the present invention, a plurality of protrusions or embossed parts is provided at some parts of one surface of the PCB, and moisture or humidity is prevented from accumulating on the PCB, such that the moisture or humidity can be easily discharged from the surface of the PCB.

In addition, the PCB contained in the PCB assembly is arranged to be tilted at a predetermined angle, such that moisture or humidity not accumulated on the PCB by a plurality of protrusions rolls down from the PCB and the moisture or humidity can be easily discharged from the PCB.

The invention claimed is:

1. A printed circuit board (PCB) apparatus comprising:
   a substrate configured to have a plurality of substrate holes;
   a printed circuit printed onto the substrate;
   at least one electronic component populated onto one surface of the substrate;
   a photoimageable solder resist (PSR) coating provided at the one surface of the substrate; and
   a plurality of protrusions provided in at least some parts of the one surface of the substrate.

2. The PCB apparatus according to claim 1, wherein the plurality of protrusions are provided in at least some parts of a surface of the printed circuit.

3. The PCB apparatus according to claim 1, wherein the plurality of protrusions are spaced apart from each other by a predetermined distance, and the predetermined distance is not longer than a diameter of one protrusion.

4. The PCB apparatus according to claim 3, wherein the plurality of protrusions are successively and regularly arranged.

5. The PCB apparatus according to claim 1, wherein the plurality of protrusions are arranged along one side of the printed circuit, and are provided in some parts adjacent to the one side of the printed circuit.

6. The PCB apparatus according to claim 1, wherein the plurality of protrusions are provided at an entire surface of the printed circuit.

7. The PCB apparatus according to claim 1, wherein the plurality of protrusions are screen-printed onto the printed circuit.

8. The PCB apparatus according to claim 7, wherein the plurality of protrusions are formed of a photoimageable solder resist (PSR) ink material having photosensitive characteristics.

9. A printed circuit board (PCB) assembly comprising:
a printed circuit board (PCB) on which electronic components are populated;
a plurality of protrusions provided in at least some parts of a surface of the PCB in such a manner that water flows to the outside of the PCB when the water permeates into the PCB; and
a PCB housing coupled to a rear surface of the PCB so as to accommodate the PCB.

10. The PCB assembly according to claim 9, wherein the PCB is arranged to have a tilted structure through which moisture or humidity permeating into the PCB flows to the outside of the PCB along the plurality of protrusions.

11. The PCB assembly according to claim 10, wherein the plurality of protrusions are arranged at an entire surface of the PCB.

12. The PCB assembly according to claim 10, wherein the plurality of protrusions are arranged along one side of the PCB, and are provided in some parts adjacent to the one side of the PCB.

13. The PCB assembly according to claim 12, wherein the one surface of the PCB is a lower side of the PCB arranged to be tilted.

14. The PCB assembly according to claim 10, further comprising:
a tray configured to store water flowing down to a lower part of the PCB along the plurality of protrusions.

15. The PCB assembly according to claim 10, wherein the tray is supported by a lower end of the PCB housing in such a manner that the tray is located at a lower end of the PCB.

16. A washing machine comprising:
a cabinet;
a control panel provided at a front surface of the cabinet;
a printed circuit board (PCB) provided at a rear side of the control panel; and
a PCB housing coupled to a rear surface of the control panel so as to accommodate the PCB therein,
wherein the PCB includes a plurality of protrusions provided in at least some parts of a surface of the PCB in such a manner that water flows to the outside of the PCB when the water permeates into the PCB.

17. The washing machine according to claim 16, wherein the plurality of protrusions are provided at an entire surface of the PCB.

18. The washing machine according to claim 16, wherein the plurality of protrusions are arranged along a lower side of the PCB arranged to be tilted, and are provided in some parts adjacent to the lower side of the PCB.

19. The washing machine according to claim 16, further comprising:
a button unit provided in the control panel; and
a waterproofing member disposed between the button unit and the PCB so as to prevent water received in the button unit from permeating into the PCB.

* * * * *